United States Patent [19]
Norris

[11] Patent Number: 4,805,139
[45] Date of Patent: Feb. 14, 1989

[54] PROPAGATING FIFO STORAGE DEVICE

[75] Inventor: David Norris, Austin, Tex.

[73] Assignee: Advanced Micro Devices, Inc., Sunnyvale, Calif.

[21] Appl. No.: 111,476

[22] Filed: Oct. 22, 1987

[51] Int. Cl.$^4$ .................. G11C 7/00; G11C 19/00; G11C 19/28

[52] U.S. Cl. .................... 365/78; 365/189; 365/221; 377/78; 377/79

[58] Field of Search ............ 365/73, 78, 154, 156, 365/189, 221; 377/74, 78, 79

[56] References Cited

U.S. PATENT DOCUMENTS

| | | | |
|---|---|---|---|
| 4,151,609 | 4/1979 | Moss | 365/78 X |
| 4,390,970 | 6/1983 | Kay | 365/78 X |
| 4,409,680 | 10/1983 | Schnathorst et al. | 365/78 X |
| 4,651,333 | 3/1987 | Cappon | 377/74 X |
| 4,733,376 | 3/1988 | Ogawa | 365/78 X |

OTHER PUBLICATIONS

IBM-TDB Complementary FET Static Shift Register, vol. 12, No. 12, May 1970, Guensslen et al.
IBM-TDB Complementary Shift Register, vol. 13, No. 2, Jul. 1970, Hastings.

Primary Examiner—Stuart N. Hecker
Assistant Examiner—Alyssa H. Bowler
Attorney, Agent, or Firm—Davis Chin

[57] ABSTRACT

A propagating first-in, first-out (FIFO) storage device is driven by a two-phase non-overlapping clock and includes a plurality of storage cells (C1, . . . C4) and a plurality of tracking bit cell circuits (T1, . . . T4). Each of the storage cells includes first pass gate transistors (G1, . . . G8), first inverters (INV1, . . . INV8), second pass gate transistors (G9, . . . G16), and second inverters (INV9, . . . INV16). The first pass gate transistors are responsive to a control signal from the tracking circuit for loading data input signals into the first inverter means. The second pass gate transistors are responsive to a first phase of the clock for shifting the data input signals into the second inverters.

22 Claims, 4 Drawing Sheets

4,805,139

PROPAGATING FIFO STORAGE DEVICE

BACKGROUND OF THE INVENTION

This invention relates generally to storage devices and more particularly, it relates to a propagating first-in, first-out storage device which is constructed with a minimal number of circuit components than has been traditionally available.

As is well known, a data processing system generally includes a number of peripheral output equipment, such as a printer, to be acted upon by a central processing unit (CPU). The CPU is typically formed of circuits that operate at high speeds while the peripheral output equipment is operated at a lower speed. Thus, temporary storage devices have been developed which interface between the CPU and the peripheral output equipment so as to accommodate for the different rates of transferring data. One such type of temporary storage device is referred to as a first-in, first-out (FIFO) storage device which can be used whenever the incoming data rate is different from the outgoing data rate so as to store temporarily the data. For example, the data from the CPU would be transferred into the FIFO storage device at the high speed and then the data would be sent out to the peripheral output equipment at the lower speed.

Heretofore, the FIFO structures of the prior art have been quite complex since they generally have utilized a large number of functional elements such as counters, pointers, or address decoder circuitry. It has been generally concluded by those in the art that the overall cost of temporary storage devices can be minimized by using the least number of circuit components as possible. Accordingly, the propagating FIFO storage device of the present invention is formed with a minimal number of circuit components than has existed heretofore. By eliminating the need for a large number of circuit components, there has been realized not only the reduction of overall cost considerably, but also the reliability has been greatly improved since it is well known that malfunctions tend to increase with the number of parts. Moreover, it has been found that the reduction in cost due to the use of minimal number of circuit components also creates a savings in the amount of chip area required.

SUMMARY OF THE INVENTION

Accordingly, it is a general object of the present invention to provide an improved first-in, first-out storage device which is relatively simple and economical to manufacture.

It is an object of the present invention to provide a propagating first-in, first-out storage device which is constructed with a minimal number of circuit components than has been traditionally available.

It is another object of the present invention to provide a propagating first-in, first-out storage device which requires a smaller amount of chip area and thus reduces manufacturing cost.

It is still another object of the present invention to provide a propagating first-in, first-out storage device which is formed of a plurality of n-bit storage cells arranged in a push-down stack.

It is still yet another object of the present invention to provide a propagating first-in, first-out storage device which includes a plurality of storage cells and a plurality of tracking bit cell circuits.

In accordance with these aims and objectives, the present invention is concerned with the provision of a propagating first-in, first-out (FIFO) storage device which is driven by a two-phase non-overlapping clock and is formed of a plurality of n-bit storage cells arranged in a push-down stack. Each of the storage cells includes first pass gates, first inverters, second pass gates, and second inverters for storing an n-bit data word and for generating outputs at output nodes corresponding to the stored n-bit data word. The first pass gates have inputs and outputs. The first inverters have inputs coupled to the corresponding outputs of the first pass gates and outputs. The second pass gates have inputs coupled to the corresponding outputs of the first inverters and outputs. The second inverters have inputs coupled to the corresponding outputs of the second pass gates and outputs for generating the outputs corresponding to the n-bit data word.

The storage device further includes data input nodes for coupling data input signals to the inputs of the first pass gates. The first pass gates are responsive to a control signal for loading the data input signals into the first inverters. The second pass gates are responsive to a first phase of the clock for shifting the data inputs into the second inverters. A plurality of tracking bit cell circuits are responsive to a load signal and a second phase of the clock for generating the control signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1A:
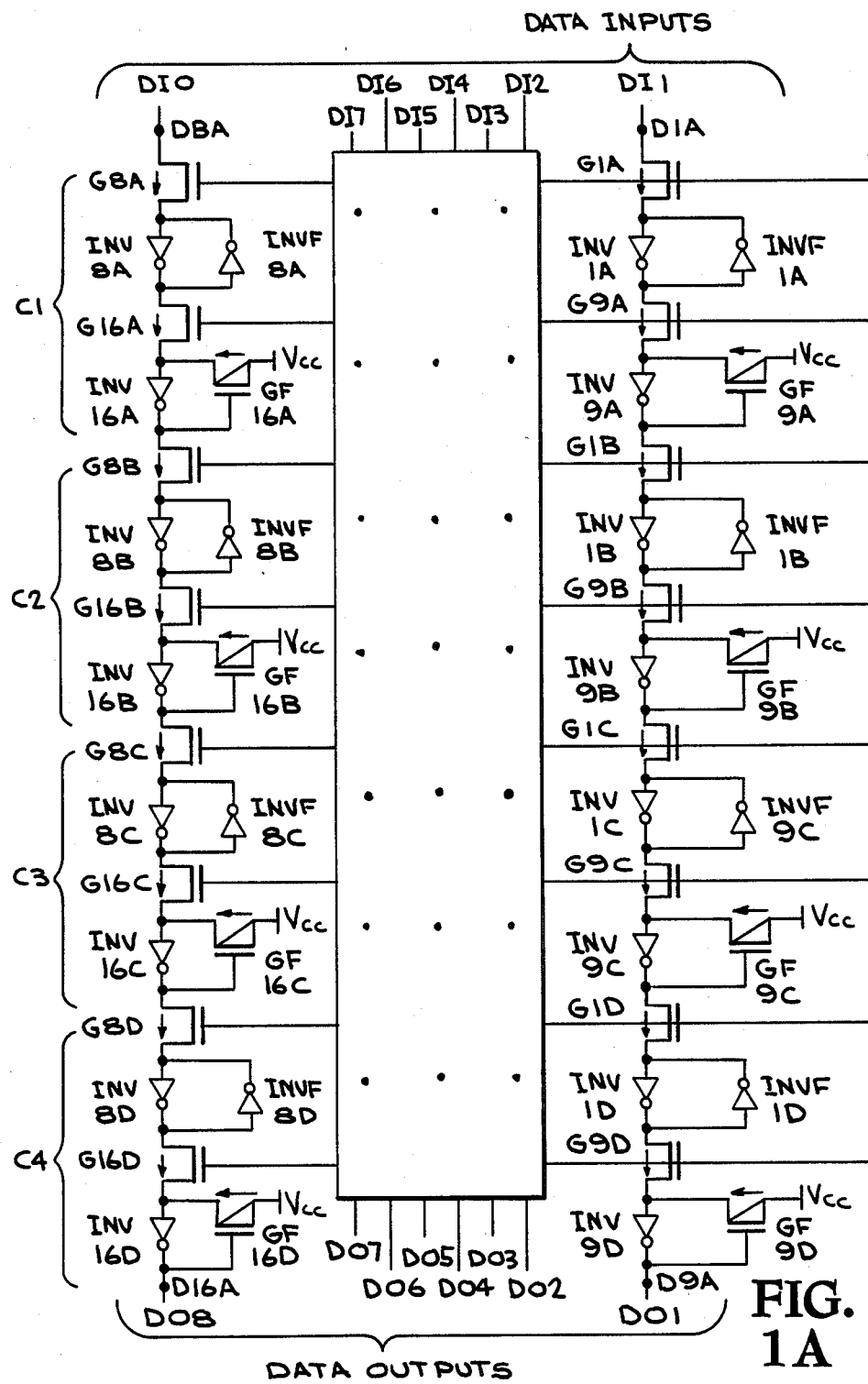
FIGS. 1(a)–1(b) are schematic circuit diagrams of a propagating first-in, first-out storage device, constructed in accordance with the principles of the present invention.
Figure 1B:
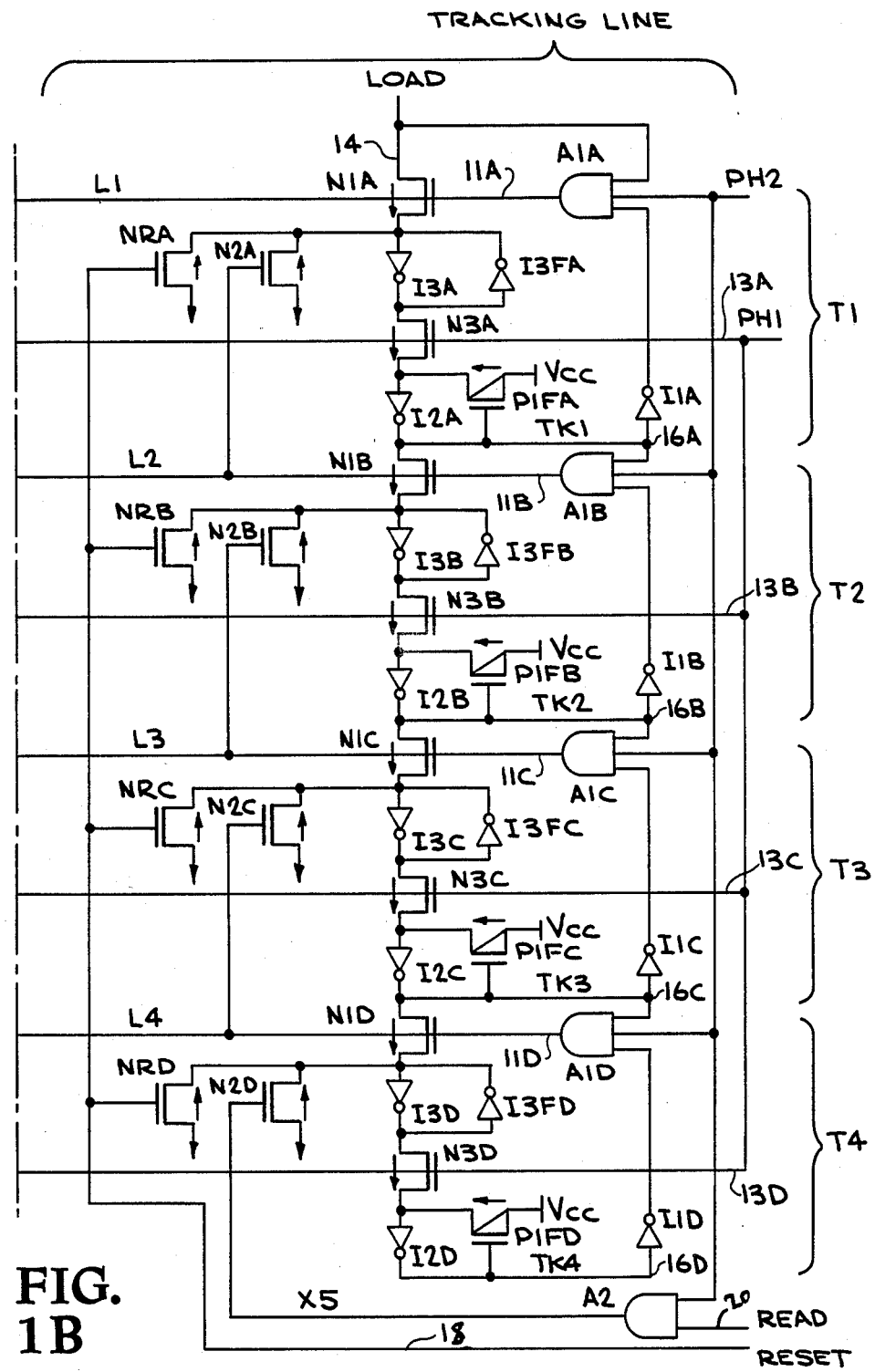

Referring now in detail to the drawings, there is shown in FIG. 1 a schematic circuit diagram of a propagating first-in, first-out (FIFO) storage device 10 of the present invention. The storage device 10 includes a stack of four-deep storage cells C1, C2, C3 and C4 which are connected together in series to provide a push-down operation. The storage device 10 further includes a tracking line 12 having a plurality of tracking bit cell circuits T1, T2, T3 and T4. Each of the tracking circuits T1, ...T4 corresponds with one of the respective storage cells C1, ...C4. While the storage cell 10 is shown with only four storage cells and four tracking circuits, it should be apparent to those skilled in the art that any larger or smaller number is possible.

The storage cell C1 is formed of a plurality of first N-channel pass gate transistors G1A...G8A, a plurality of first inverters INV1A...INV8A, a plurality of second N-channel pass gate G9A...G16A, and a plurality of second inverters INV9A...INV16A. Each of the transistors G1A, ...G8A has a drain electrode connected to one of the data input nodes D1A, ...D8A for receiving corresponding data input signals DI1, ...DI8. Each of the transistors G1A, ...G8A has a source electrode connected to a corresponding input of the respective first inverters INV1A, ...INV8A. Each of the second N-channel pass gates G9A, ...G16A has a drain electrode connected to one of the corresponding outputs of the first inverters INV1A, ...INV8A. Each of the second N-channel pass gate transistors G9A, ...G16A has a source electrode connected to a corresponding input of the respective second inverters INV9A, ...INV16A. Each of the second inverters INV9A, ...INV16A has a corresponding output connected to the corresponding drain electrodes of the first N-channel pass gate transistors G1B, ...G8B in the second storage cell C2. The gate electrodes of the first pass gate transistors G1A, ...G8A are connected to a control signal L1 from the tracking bit cell circuit T1, and the gate electrodes of the second pass gate transistors G9A, ...G16A are connected to a first phase clock signal PH1 from a non-overlapping clock.

The storage cell C1 further includes a plurality of feedback inverters INVF1A...INVF8A and a plurality of P-channel feedback transistors GF9A...GF16A. Each of feedback inverters INVF1A...INVF8A has a corresponding input connected to the corresponding outputs of the first inverters INV1A...INV8A and a corresponding output connected to the corresponding inputs of the first inverters INV1A...INV8A. Each of the feedback transistors GF9A...GF16A has its gate electrode connected to the corresponding outputs of the second inverters INV9A...INV16A, its drain electrode connected to the corresponding inputs of the second inverters INV9A...INV16A, and its source electrode connected to a supply potential VCC.

Similarly, the storage cell C2 is formed of a plurality of first N-channel pass gate transistors G1B, ...G8B, a plurality of first inverters INV1B, ...INV8B, a plurality of second N-channel pass gate transistors G9B, ...G16B and a plurality of second inverters INV9B, ...INV16B. Each of the transistors G1B, ...G8B has a drain electrode connected to the corresponding outputs of the second inverters INV9A, ...INV16A of the first cell C1. Each of the transistors G1B, ...G8B has a source electrode connected to a corresponding input of the respective first inverters INV1B, ...INV8B. Each of the second N-channel pass gate transistors G9B, ...G16B has a drain electrode connected to one of the corresponding outputs of the first inverters INV1B, ...INV8B. Each of the second N-channel pass gate transistors G9B, ...G16B has a source electrode connected to a corresponding input of the respective second inverters INV9B, ...INV16B. Each of the second inverters INV9B, ...INV16B has a corresponding output connected to the corresponding drain electrodes of the first N-channel pass transistors G1C, ...G8C in the third cell C3. The gate electrodes of the first pass gate transistors G1B, ...G8B are connected to a control signal L2 from the tracking bit cell T2, and the gate electrodes of the second pass gate transistors G9B, ...G16B are connected to the first phase clock signal PH1.

The storage cell C2 further includes a plurality of feedback inverters INVF1B...INVF8B and a plurality of P-channel feedback transistors GF9B...GF16B. Each of feedback inverters INVF1B...INVF8B has a corresponding input connected to the corresponding outputs of the first inverters INV1B...INV8B and a corresponding output connected to the corresponding inputs of the first inverters INV1B...INV8B. Each of the feedback transistors GF9B...GF16B has its gate electrode connected to the corresponding outputs of the second inverters INV9B...INV16B, its drain electrode connected to the corresponding inputs of the second inverters INV9B...INV16B, and its source electrode connected to the supply potential VCC.

Further, the storage cell C3 is formed of a plurality of first N-channel pass gate transistors G1C, ...G8C, a plurality of first inverters INV1C, ...INV8C, a plurality of second N-channel pass gate transistors G9C, ...G16C and a plurality of second inverters INV9C, ...INV16C. Each of the transistors G1C, ...G8C has a drain electrode connected to the corresponding outputs of the second inverters INV9B, ...INV16B of the second cell C2. Each of the transistors G1C, ...G8C has a source electrode connected to a corresponding input of the respective first inverters INV1C, ...INV8C. Each of the second N-channel pass gate transistors G9C, ...G16C has a drain electrode connected to one of the corresponding outputs of the first inverters INV1C, ...INV8C. Each of the second N-channel pass gate transistors G9C, ...G16C has a source electrode connected to a corresponding input of the respective second inverters INV9C, ...INV16C. Each of the second inverters INV9C, ...INV16C has a corresponding output connected to the corresponding drain electrodes of the first N-channel pass transistors G1D, ...G8D in the fourth cell C4. The gate electrodes of the first pass gate transistors G1C, ...G8C are connected to a control signal L3 from the tracking bit cell T3, and the gate electrodes of the second pass gate transistors G9C, ...G16C are connected to the first phase clock signal PH1.

The storage cell C3 further includes a plurality of feedback inverters INVF1C...INVF8C and a plurality of P-channel feedback transistors GF9C...GF16C. Each of feedback inverters INVF1C...INVF8C has a corresponding input connected to the corresponding outputs of the first inverters INV1C...INV8C and a corresponding output connected to the corresponding inputs of the first inverters INV1C...INV8C. Each of the feedback transistors GF9C...GF16C has its gate electrode connected to the corresponding outputs of the second inverters INV9C...INV16C, its drain electrode connected to the corresponding inputs of the second inverters INV9C...INV16C, and its source electrode connected to the supply potential VCC.

Finally, the storage cell C4 is formed of a plurality of first N-channel pass gate transistors G1D, ...G8D, a plurality of first inverters INV1D, ...INV8D, a plurality of second N-channel pass gate transistors G9D, ...G16D and a plurality of second inverters INV9D, ...INV16D. Each of the transistors G1D, ...G8D has a drain electrode connected to the corresponding outputs of the second inverters INV9C, ...INV16C of the third cell C3. Each of the transistors G1D, ...G8D has a source electrode connected to a corresponding input of the respective first inverters INV1D, ...INV8D. Each of the second N-channel pass gate transistors G9D, ...G16D has a drain electrode connected to one of the corresponding outputs of the first inverters INV1D, ...INV8D. Each of the second N-channel pass gate transistors G9D, ...G16D has a source electrode connected to a corresponding input of the respective second inverters INV9D, ...INV16D. Each of the second inverters INV9D, ...INV16D has a corresponding output connected to one of the data output nodes D9A, ...D16A for generating corresponding data output signals D01, ...D08. The gate electrodes of the first pass gate transistors G1D, ...G8D are connected to a control signal L4 from the tracking bit cell T4, and the gate electrodes of the second pass gate transistors G9D, ...G16D are connected to the first phase clock signal PH1.

The storage cell C4 further includes a plurality of feedback inverters INVF1D...INVF8D and a plurality of P-channel feedback transistors GF9D...GF16D. Each of feedback inverters INVF1D...INVF8D has a corresponding input connected to the corresponding outputs of the first inverters INV1D...INV8D and a corresponding output connected to the corresponding inputs of the first inverters INV1D...INV8D. Each of the feedback transistors GF9D...GF16D has its gate electrode connected to the corresponding outputs of the second inverters INV9D...INV16D, its drain electrode connected to the corresponding inputs of the second inverters INV9D...INV16D, and its source electrode connected to the supply potential VCC.

While it is noted that each of the cells C1, ...C4 are formed with eight first pass gate transistors, eight first inverters, eight feedback inverters, eight second pass gate transistors, eight second inverters and eight feedback transistors so as to permit receiving and shifting of an 8-bit data word, it should be understood that any number could be used in order to accommodate an n-bit data word. Therefore, it should be clear that any number of storage cells could be used and arranged in a push-down stack. Further, each of the storage cells can be easily adapted to accommodate the bit size of the data word.

The tracking bit cell circuit T1 is formed of a three-input AND logic gate A1A; inverters I1A, I2A and I3A; and N-channel pass gate transistors N1A, N2A and N3A. The logic gate A1a has a first input connected to the drain of the pass gate transistor N1A and to a load input node 14 for receiving a load signal L, a second input connected to receive a clock signal PH2, and a third input connected to the output of the inverter I1A. The output of the logic gate A1A on line 11A defines the control signal L1 and is connected to the gate of the pass gate transistor N1A as well as to all of the gates of the first pass gate transistors G1A, ...G8A in the storage cell C1. The source of the transistor N1A is connected to the drain of the transistor N2A and to the input of the inverter I3A. The source of the transistor N2A is connected to a ground potential, and the gate of the transistor N2A is connected to the control signal L2 at the output of the AND logic gate A1B on line 11B in the second tracking circuit T2. The output of the inverter I3A is connected to the drain of the transistor N3A. The gate of the transistor N3A is connected to receive a clock signal PH1 on line 13A signal and is further connected to all of the gates of the second pass gate transistors G9A, ...G16A in the storage cell C1. The source of the transistor N3A is connected to the input of the inverter I2A. The output of the inverter I2A having a place holder signal TK1 is connected to an output node 16A which is the output of the tracking circuit T1 and to the input of the inverter I1A. The output of the inverter I2A is also connected to the first input of the AND logic gate A1B and thus corresponds to the load signal L for the next higher storage cell, or in this case cell C2.

The tracking bit circuit T1 further includes a P-channel feedback transistor PIFA, a feedback inverter I3FA, and an N-channel reset transistor NRA. The feedback transistor PIFA has its gate electrode connected to the output of the inverter I2A, its drain electrode connected to the input of the inverter I2A, and its source electrode connected to the supply potential VCC. The feedback inverter I3FA has its input connected to the output of the inverter I3A and its output connected to the input of the inverter I3A. The reset transistor NRA has its gate electrode connected to receive a reset signal R on line 18, its drain electrode connected also to the input of the inverter I3A, and its source electrode connected to the ground potential.

Similarly, the tracking bit cell circuit T2 is formed of a three-input AND logic gate A1B; inverters I1B, I2B and I3B; and N-channel pass gate transistors N1B, N2B and N3B. The logic gate A1B has a first input connected to the drain of the pass gate transistor N1B and to the output node 16A for receiving the place holder signal TK1 corresponding to the load signal L, a second input connected to receive the clock signal PH2, and a third input connected to the output of the inverter I1B. The output of the logic gate A1B on line 11B defines the control signal L2 of the circuit T2 and is connected to the gate of the pass gate transistor N1B as well as to all of the gates of the first pass gate transistors G1B, ...G8B in the storage cell C2. The source of the transistor N1B is connected to the drain of the transistor N2B and to the input of the inverter I3B. The source of the transistor N2B is connected to the ground potential, and the gate of the transistor N2B is connected to the control signal L3 at the output of the AND logic gate A1C on line 11C in the third tracking circuit T3. The output of the inverter I3B is connected to the drain of the transistor N3B. The gate of the transistor N3A is connected to receive the clock signal PH1 on line 13B and is further connected to all of the gates of the second pass gate transistors G9B, ...G16B in the storage cell C2. The source of the transistor N3B is connected to the input of the inverter I2B. The output of the inverter I2B having a place holder signal TK2 is connected to an output node 16B which is the output of the tracking circuit T2 and to the input of the inverter I1B. The output of the inverter I2B is also connected to the first input of the AND logic gate A1C and thus corresponds to the load signal L for the next higher storage cell, or in this case cell C3.

The tracking bit circuit T2 further includes a P-channel feedback transistor P1FB, a feedback inverter I3FB, and an N-channel reset transistor NRB. The feedback transistor PIFB has its gate electrode connected to the output of the inverter I2B, its drain electrode connected to the input of the inverter I2B, and its source electrode connected to the supply potential VCC. The feedback inverter I3FB has its input connected to the output of the inverter I3B and its output connected to the input of the inverter I3B. The reset transistor NRB has its gate electrode connected to receive the reset signal R on line 18, its drain electrode connected also to the input of the inverter I3B, and its source electrode connected to the ground potential.

Further, the tracking bit cell circuit T3 is formed of a three-input AND logic gate A1C; inverters I1C, I2C and I3C; and N-channel pass gate transistors N1C, N2C and N3C. The logic gate A1C has a first input connected to the drain of the pass gate transistor N1C and to the output node 16B for receiving the place holder signal TK2 corresponding to the load signal L, a second input connected to receive the clock signal PH2, and a third input connected to the output of the inverter I1C.

The output of the logic gate A1C on line 11C defines the control signal L3 of the circuit T3 and is connected to the gate of the pass gate transistor N1C as well as to all of the gates of the first pass gate transistors G1C, ...G8C in the storage cell C3. The source of the transistor N1C is connected to the drain of the transistor N2C and to the input of the inverter I3C. The source of the transistor N2C is connected to the ground potential, and the gate of the transistor N2C is connected to the control signal L4 at the output of the AND logic gate A1D on line 11D in the fourth tracking circuit T4. The output of the inverter I3C is connected to the drain of the transistor N3C. The gate of the transistor N3C is connected to receive the clock signal PH1 on line 13C and is further connected to all of the gates of the second pass gate transistors G9C, ...G16C in the storage cell C3. The source of the transistor N3C is connected to the input of the inverter I2C. The output of the inverter I2C having a place holder signal TK3 is connected to an output node 16C which is the output of the tracking circuit T3 and to the input of the inverter I1C. The output of the inverter I2C is also connected to the first input of the AND logic gate A1D and thus corresponds to the load signal L for the next higher storage cell, or in this case cell C4.

The tracking bit circuit T3 further includes a P-channel feedback transistor PIFC, a feedback inverter I3FC, and an N-channel reset transistor NRC. The feedback transistor PIFC has its gate electrode connected to the output of the inverter I2C, its drain electrode connected to the input of the inverter I2C, and its source electrode connected to the supply potential VCC. The feedback inverter I3FC has its input connected to the output of the inverter I3C and its output connected to the input of the inverter I3C. The reset transistor NRC has its gate electrode connected to receive the reset signal R on line 18, its drain electrode connected also to the input of the inverter I3C, and its source electrode connected to the ground potential.

Finally, the tracking bit cell circuit T4 is formed of a three-input AND logic gate A1D; inverters I1D, I2D and I3D; and N-channel pass gate transistors N1D, N2D and N3D. The logic gate A1D has a first input connected to the drain of the pass gate transistor N1D and to the output node 16C for receiving the place holder signal TK3 corresponding to the load signal L, a second input connected to receive the clock signal PH2, and a third input connected to the output of the inverter I1D. The output of the logic gate A1D on line 11D defines the control signal L4 of the circuit T4 and is connected to the gate of the pass gate transistor N1D as well as to all of the gates of the first pass gate transistors G1D, ...G8D in the storage cell C4. The source of the transistor N1D is connected to the drain of the transistor N2D and to the input of the inverter I3D. The source of the transistor N2D is connected to the ground potential, and the gate of the transistor N2D is connected to a "read" signal X5 on line 20 via the output of an AND logic gate A2 in the fourth tracking circuit T4. The output of the inverter I3D is connected to the drain of the transistor N3D. The gate of the transistor N3D is connected to receive the clock signal PH1 on line 13D and is further connected to all of the gates of the second pass gate transistors G9D, ...G16D in the storage cell C4. The source of the transistor N3D is connected to the input of the inverter I2D. The output of the inverter I2D is connected to an output node 16D which is the output of the tracking circuit T4 and to the input of the inverter I1D.

The tracking bit circuit T4 further includes a P-channel feedback transistor PIFD, a feedback inverter I3FD, and an N-channel reset transistor NRD. The feedback transistor PIFD has its gate electrode connected to the output of the inverter I2D, its drain electrode connected to the input of the inverter I2D, and its source electrode connected to the supply potential VCC. The feedback inverter I3FD has its input connected to the ouput of the inverter I3D and its output connected to the input of the inverter I3D. The reset transistor NRA has its gate electrode connected to receive the reset signal R on line 18, its drain electrode connected also to the input of the inverter I3D, and its source electrode connected to the ground potential.

Figure 2:
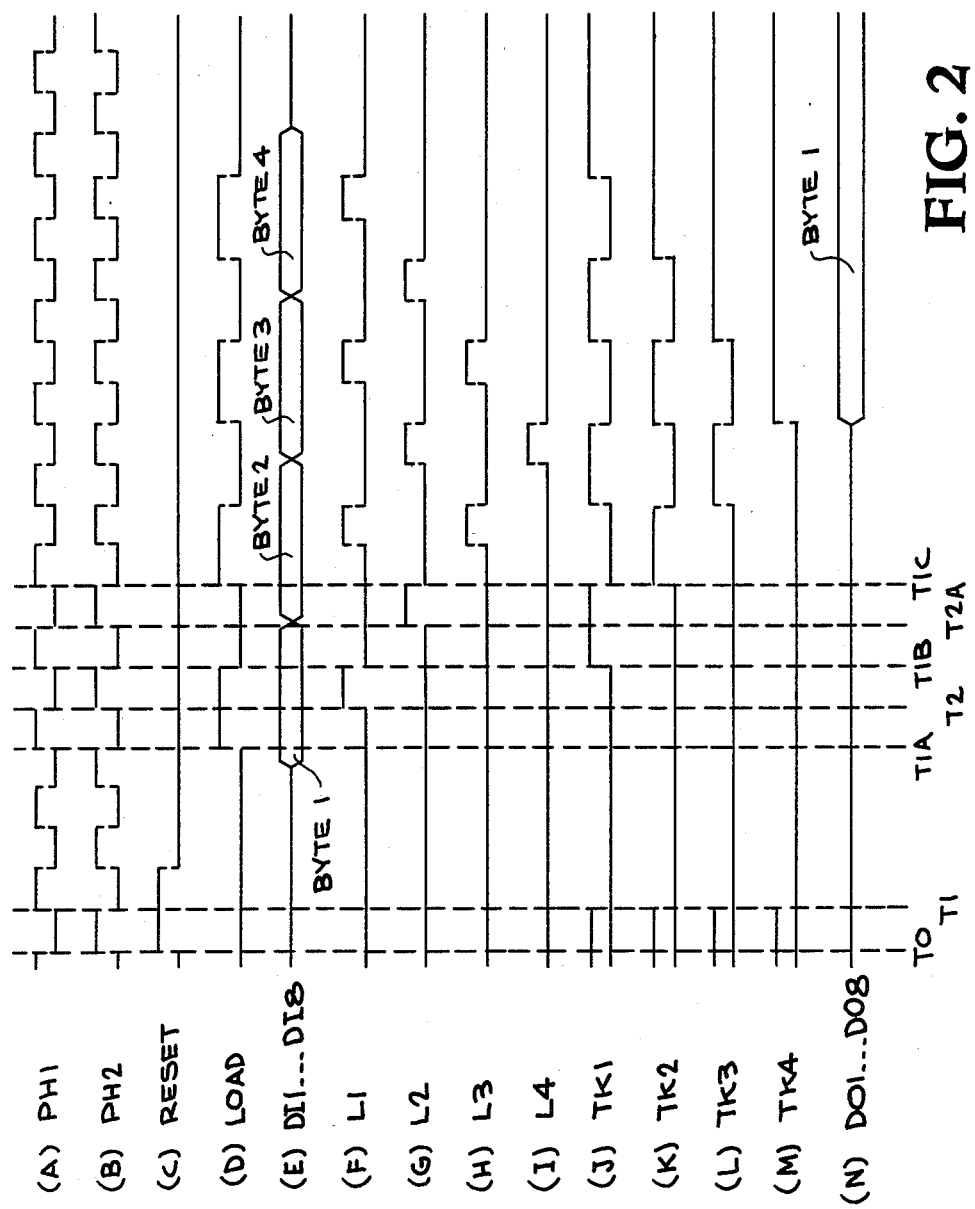
FIGS. 2(a)–2(n) are waveforms useful in understanding the loading operation of FIG. 1.

The loading and shifting operation of the circuit of FIG. 1 will now be explained with reference to the waveforms in FIGS. 2(a)–2(n) which are useful in understanding the invention. Initially, it will be assumed that the inputs of the inverters I3A, I3B, I3C and I3D have all be reset to the logic "0" level at the time t0. This is achieved by applying the reset signal R to the gates of the reset transistors NRA...NRD, which is shown in FIG. 2(c). Thus, the output of the inverters I3A, ...I3D will be at the logic "1" level. Further, the clock is a two-phase non-overlapping clock generated by conventional means such as by a free-running oscillator in which the clock signal PH2 is non-overlapping with the clock signal PH1. This is shown in FIGS. 2(a) and 2(b), respectively. Accordingly, when the clock signal PH1 goes high or logic "1" level at the time t1, the pass gate transistors N3A, ...N3D in the respective storage cells C1, ...C4 will be turned on so as to cause the outputs of the inverters I2A, ...I2D to be at the logic "0" level. The logic "0" level of the respective output signals TK1...TK4 of the tracking circuits T1, ...T4 shown in respective FIGS. 2(j), 2(k), 2(l) and 2(m) indicates that the corresponding storage cells C1, ...C4 are empty and ready to accept data.

At this point, in order to load the data input signals DI1, ...DI8 depicted in FIG. 2(e) into the storage cell C1, there is required a load signal L which is shown in FIG. 2(d). While both the output of the inverter I1A and the load signal L will be at the logic "1" level at the time t1a, no transfer or shifting of data will occur until the clock signal PH2 goes high at the time t2, thereby causing the control signal L1 shown in FIG. 2(f) at the output of the AND logic gate A1A to go high. This will, in turn, cause the turning on of the first pass gate transistors G1A, ...G8A which allows the data to be shifted or propagated from the drains of the transistors G1A, ...G8A to the drains of the second pass gate transistors G9A, ...G16A. In addition, the pass gate transistor N1A will be turned on so as to change the output of the inverter I3A to the logic "0" level. When the next time the clock signal PH1 goes high at the time t1b, the data is shifted or propagated from the drains of the second pass gate transistors G9A, ...G16A to the outputs of the second inverters INV9A, ...INV16A. Simultaneously, the output of the inverter I2A or the place holder signal TK1 (FIG. 2(j)) of the tracking circuit T1 at the node 16A will go to a logic "1" level which indicates that the cell C1 is full.

As previously stated, the output of the inverter I2A also corresponds to the load signal for the next higher storage cell C2. Since the output of the inverter I2A is high and the output of the inverter I1B is high, the next time the clock PH2 goes high at the time t2a the output of the AND gate A1B will go high. This is the control signal L2 which is illustrated in FIG. 2(g). As a result, the pass gate transistors G1B, ...G8B will be turned on which allows the data to be shifted or pushed down from the drains of the first pass gate transistors G1B, ...G8B to the drains of the second pass gate transistors G9B, ...G16B. In addition, the pass gate N1B will be turned on so as to change the output of the inverter I3B to the logic "0" level. When the next time the clock PH1 goes high at the time t1c, the data is shifted or propagated from the drains of the pass gate transistors G9B, ...G16B to the outputs of the inverters INV9B, ...INV16B. Simultaneously, the output of the inverter I2B or the place holder signal TK2 of the tracking circuit T2 at the node 16b will go to a logic "1" level which indicates that the cell C2 is full. This signal TK2 is shown in FIG. 2(k). Further, the pass gate transistor N2A will be turned on so as to reset the input of the inverter I3A to a logic "0" level. After the clock signal PH1 goes high at the time t1c, the output of the inverter I2A will be at the logic "0" level (FIG. 2(j)) indicating that the cell C1 has been cleared and is ready to accept new data.

This process described above is repeated over and over again until the data (FIG. 2(e)) from the input nodes D1A, ...D8A has been shifted or propagated to the output nodes D9A, ...D16A. It will take four cycles of the clock signals PH2 and PH1 after the time t1a before the first data word or byte reaches the output nodes D9A, ...D16A. The data output signals D01...D08 for the first byte are shown in FIG. 2(n).

Figure 3:
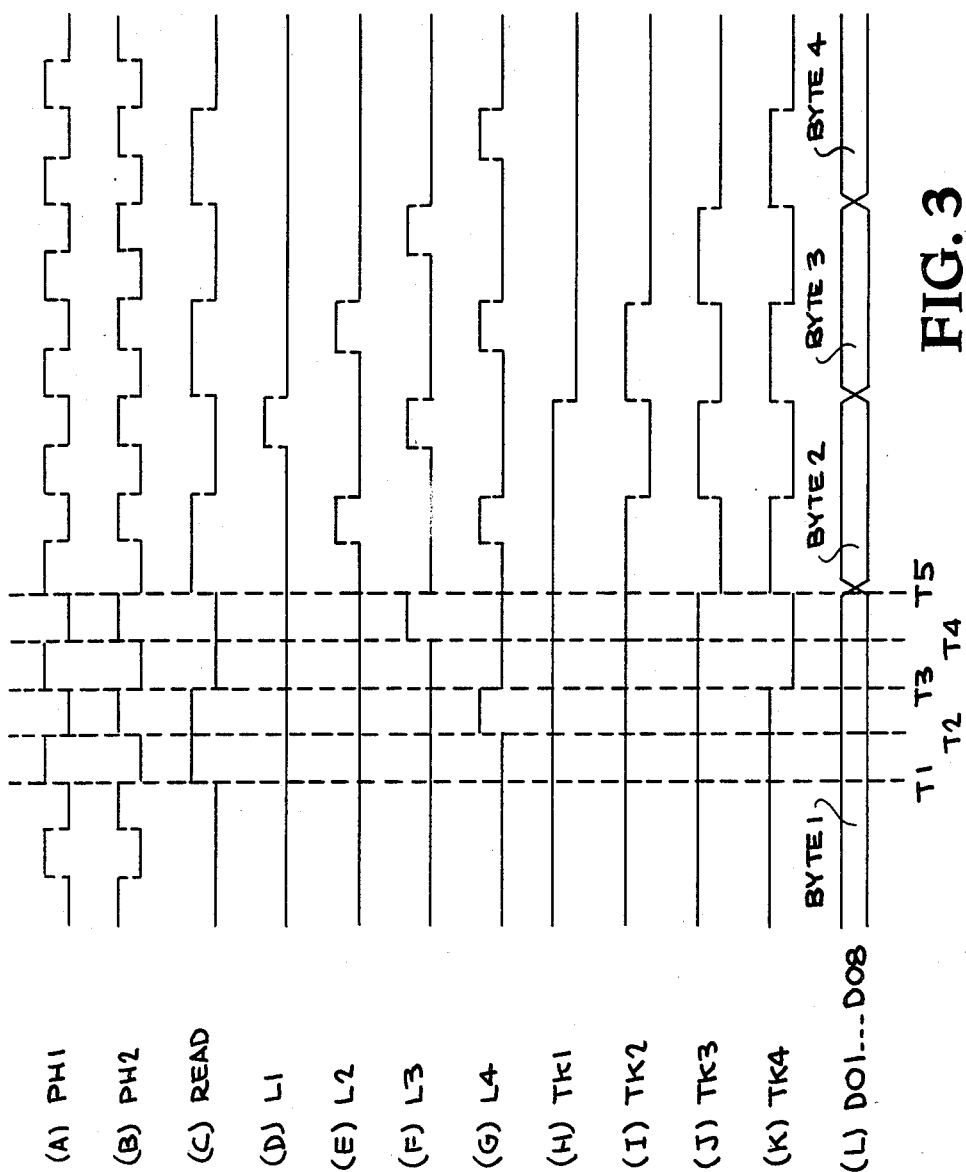
FIGS. 3(a)–3(l) are waveforms useful in understanding the "read" operation of FIG. 1.

The "read" operation of the circuit of FIG. 1 will now be described with reference to the waveforms in FIGS. 3(a)-3(l) which are useful in understanding the invention. Now, assume that the storage cell C1, ...C4 are fully loaded with data. Thus, the outputs of the inverters I2A, ...I2A are at a logic "1" level. These are the output signals TK1...TK4 which are illustrated in respective FIGS. 3(i), 3(j), 3(k) and 3(l). Further, the data from the storage cell C4 will be available at the output of the inverters INV9D, ...INV16D. If it is desired to read the data from the storage cell C3, a signal READ, as shown in FIG. 3(c) is applied to the AND logic gate A2 at the time t1. At the time t2 when the clock signal PH2 goes high, the output signal from the logic gate A2 will go high and turn on the pass gate transistor N2D which resets the input of the inverter I3D to the logic "0" level. After the next clock signal PH1 going high at the time t3, the output signal TK4 shown in FIG. 3(l) at the output of the inverter I2D will go to the logic "0" level indicating that the storage cell C4 has been cleared and is ready to receive data. At the next clock signal PH2 going high at the time t4, the output of the logic gate A1D (the signal L4 as shown in FIG. 3(h)) will go high, thereby causing shifting of data from the drain of the first pass gate transistors G1D, ...G8D to the drains of the second pass gate transistors G9D, ...G16D. At the next clock signal PH1 going high at the time t5, the data will be further shifted to the output of the storage cell C4 at the outputs of the inverters INV9D, ...INV16D. The data output signals D01...D08 are shown in FIG. 3(d).

From the foregoing detailed description, it can thus be seen that the present invention provides an improved propagating first-in, first-out storage device which is constructed with a minimal number of circuit components. Further, the instant storage devices is formed of a plurality of storage cells arranged in a push-down stack and a plurality of tracking bit cell circuits.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A propagating first-in, first-out (FIFO) storage device, said storage device being driven by a two-phase non-overlapping clock, said storage device comprising:
   a plurality of n-bit storage cells (C1, ... C4) arranged in a push-down stack, each of said storage cells including first pass gate means, first inverter means, second pass gate means, and second inverter means for storing an n-bit data word and for generating outputs corresponding to said stored n-bit data word;
   said first pass gate means having inputs and outputs, said first inverter means having inputs coupled to the corresponding outputs of said first pass gate means and outputs, said second pass gate means having inputs coupled to the corresponding outputs of said first inverter means and outputs, and said second inverter means having inputs coupled to the corresponding outputs of said second pass gate means and outputs for generating the outputs corresponding to said n-bit data word;
   data input nodes for coupling data input signals to the inputs of said first pass gate means;
   said first pass gate means being responsive to a control signal for loading said data input signal into said first inverter means;
   said second pass gate means being responsive to a first phase of said clock for shifting said data into said second inverter means; and
   a plurality of tracking bit cell circuits (T1, ...T4) responsive to a load signal and a second phase of said clock for generating said control signals.

2. A propagating FIFO storage device as claimed in claim 1, wherein said first pass gate means comprises a plurality of first N-channel transistors (G1A, ...G8A).

3. A propagating FIFO storage device as claimed in claim 2, wherein said first inverter means comprises a plurality of first inverters (INV1A, ...INV8A).

4. A propagating FIFO storage device as claimed in claim 3, wherein said second pass gate means comprises a plurality of second N-channel transistors (G9A, ...G16A).

5. A propagating FIFO storage device as claimed in claim 4, wherein said second inverter means comprises a plurality of second inverters (INV9A, ...INV16A).

6. A propagating FIFO storage device as claimed in claim 5, wherein each of said plurality of first N-channel transistors (G1A, ...G8A) has a corresponding drain electrode coupled to one of the respective data input nodes, a corresponding source electrode coupled to one of the respective inputs of said first inverters (INV1A, ...INV8A), and a corresponding gate electrode coupled to the control signal.

7. A propagating FIFO storage device as claimed in claim 6, wherein each of said plurality of second N-channel transistors (G9A, ...G16A) has a corresponding drain electrode coupled to one of the respective outputs of said first inverters (INV1A, ...INV8A), a corresponding source electrode coupled to one of the respective inputs of said second inverters (INV9A, ...INV16A), and a corresponding gate electrode coupled to the first phase of said clock.

8. A propagating FIFO storage device as claimed in claim 7, wherein each of said tracking bit cell circuits (T1, ...T4) include an AND logic gate means (A1A, ...A1D), third, fourth and fifth inverters (I1, I2, I3), and third, fourth and fifth N-channel transistors (N1, N2, N3).

9. A propagating FIFO storage device as claimed in claim 8, wherein said logic gate means comprises a three-input AND logic gate (A1) which has a first input coupled to the load signal, a second input coupled to the first phase of said clock, a third input coupled to the output of said fifth inverter (I3), and an output for generating the control signal.

10. A propagating FIFO storage device as claimed in claim 9, wherein said output of said logic gate (A1) is coupled to the gate of said third N-channel transistor (N1), said third N-channel transistor (N1) having its drain coupled to the load signal and its source coupled to the input of said fifth inverter (I3) and to the drain of said fourth N-channel transistor (N2), said fourth N-channel transistor (N2) having its source coupled to a ground potential and its gate coupled to a second control signal, the output of said fifth inverter (I3) being coupled to the drain of said fifth N-channel transistor (N3), the gate of said fifth N-channel transistor (N3) being coupled to the first phase of said clock and its source coupled to the input of said fourth inverter (I2), the output of said fourth inverter defining the output of said tracking bit cell circuit and being coupled to the input of said third inverter (I1).

11. A propagating FIFO storage device as claimed in claim 10, wherein said second control signal is defined by the output of said AND logic gate (A1) in the next higher storage cell in the stack.

12. A propagating FIFO storage device as claimed in claim 11, wherein the outputs (16) of said tracking circuits (T1, ...T4) defines the load signal for the next higher storage cell in the stack.

13. A propagating FIFO storage device as claimed in claim 12, further comprising a second AND logic gate (A2) which has a first input coupled to the first phase of the clock and a second input coupled to a read signal, and an output for generating the second control signal for the highest storage cell in the stack.

14. A propagating FIFO storage device as claimed in claim 8, wherein each of said tracking bit cell circuits (T1, ...T4) include a P-channel feedback transistor (P1FA, ...P1FD), a feedback inverter (I3FA, ...I3FD), and an N-channel reset transistor (NRA, ...NRD).

15. A propagating FIFO storage device as claimed in claim 7, wherein each of said storage cells (C1, ...C4) includes a plurality of feedback inverters (INVF1A...INVF8A) and a plurality of feedback transistors (GF9A...Gf16A).

16. A propagating FIFO storage device as claimed in claim 1, wherein each of said tracking bit cell circuits (T1, ...T4) include an AND logic gate means (A1A, ...A1D), first, second and third inverters (I1, I2, I3), and first, second and third N-channel transistors (N1, N2, N3).

17. A propagating FIFO storage device as claimed in claim 16, wherein said logic gate means comprises a three-input AND logic gate (A1) which has a first input coupled to the load signal, a second input coupled to the first phase of said clock, a third input coupled to the output of said third inverter (I3), and an output for generating the control signal.

18. A propagating FIFO storage device as claimed in claim 17, wherein said output of said logic gate (A1) is coupled to the gate of said first N-channel transistor (N1), said first N-channel transistor (N1) having its drain coupled to the load signal and its source coupled to the input of said third inverter (I3) and to the drain of said second N-channel transistor (N2), said second N-channel transistor (N2) having its source coupled to a ground potential and its gate coupled to a second control signal, the output of said third inverter (I3) being coupled to the drain of said third N-channel transistor (N3), the gate of said third N-channel transistor (N3) being coupled to the first phase of said clock signal and its source coupled to the input of said second inverter (I2), the output of said second inverter defining the output of said tracking bit cell circuit and being coupled to the input of said first inverter (I1).

19. A propagating FIFO storage device as claimed in claim 18, wherein said second control signal is defined by the output of said AND logic gate (A1) in the next higher storage cell in the stack.

20. A propagating FIFO storage device as claimed in claim 19, wherein the outputs (16) of said tracking circuits (T1, ...T4) defines the load signal for the next higher storage cell in the stack.

21. A propagating FIFO storage device as claimed in claim 20, further comprising a second AND logic gate (A2) which has a first input coupled to the first phase of the clock and a second input coupled to a read signal, and an output for generating the second control signal for the highest storage cell in the stack.

22. A propagating FIFO storage device as claimed in claim 21, wherein the outputs of said second inverters (INV9D, ...INV16D) in the highest storage cell (C4) are coupled to the data output nodes (D9A, ...D16A) for generating data output signals (D01, ...D08).

* * * * *